United States Patent [19]
Kawaguchi

[11] Patent Number: 6,044,037
[45] Date of Patent: Mar. 28, 2000

[54] SEMICONDUCTOR DEVICE

[75] Inventor: Takayuki Kawaguchi, Yokohama, Japan

[73] Assignee: Kabushiki Kaisha Toshiba, Kanagawa-ken, Japan

[21] Appl. No.: 09/103,234

[22] Filed: Jun. 23, 1998

[30] Foreign Application Priority Data

Jun. 23, 1997 [JP] Japan ................................. 9-166246

[51] Int. Cl.⁷ .................................................. G11C 8/00
[52] U.S. Cl. .............................. 365/233.5; 365/189.05; 365/194; 327/26
[58] Field of Search .......................... 365/233.5, 194, 365/189.05; 327/26, 24, 80, 81, 161, 277

[56] References Cited

U.S. PATENT DOCUMENTS

| | | | |
|---|---|---|---|
| 5,519,666 | 5/1996 | McAdams | 365/233.5 |
| 5,557,226 | 9/1996 | Honda | 327/81 |
| 5,682,355 | 10/1997 | Roohparvar | 365/233.5 |
| 5,734,282 | 3/1998 | Choi et al. | 365/233.5 |
| 5,831,930 | 11/1998 | Hotta | 365/233.5 |

OTHER PUBLICATIONS

Kawaguchi, et al. "Semiconductor Circuit Device," Toshiba Technical Disclosure Bulletin vol. 13–52, Doc. 95–4765, Jul. 27, 1995, pp. 67–69.

*Primary Examiner*—Son T. Dinh
*Attorney, Agent, or Firm*—Loeb & Loeb LLP

[57] ABSTRACT

A semiconductor device which enables quick and reliable adjustment of the address transition detection pulse width has an address transition detector (ATD) and n PMOS transistors connected in parallel to an output terminal, the PMOS transistors behaving as pull-up transistors for the ATD. The PMOS transistors are controlled by controlling outputs of n controllers which generate the outputs from a pulse-like waveform applied to an input terminal thereof, thus the size of the PMOS transistors are substantially changed.

6 Claims, 9 Drawing Sheets

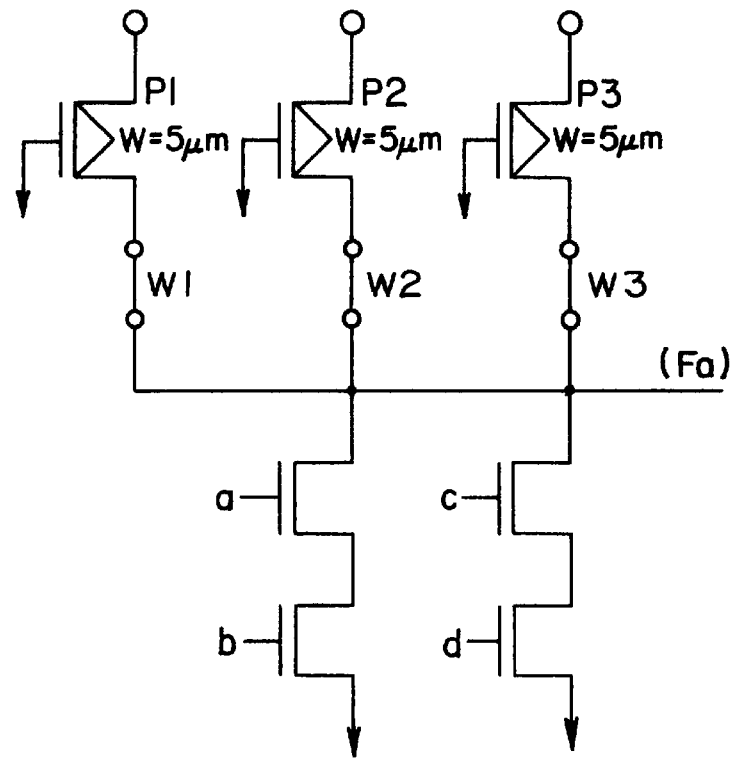
FIG. 10
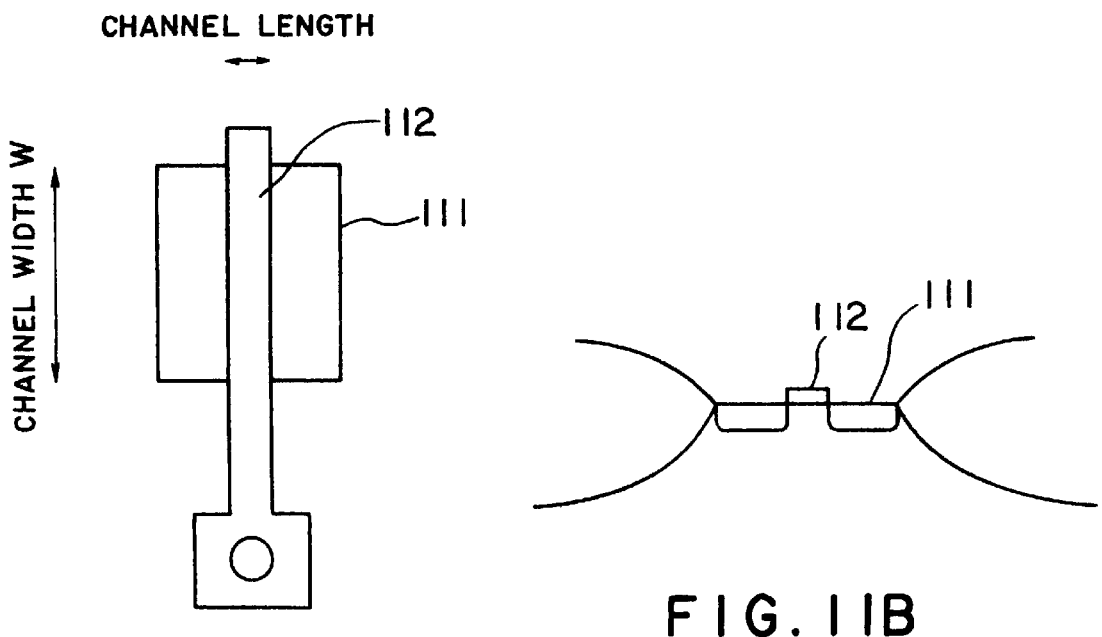
FIG. 11A
FIG. 11B

SEMICONDUCTOR DEVICE

BACKGROUND OF THE INVENTION

This invention relates to a semiconductor device and, more particularly, to one having an address transition detector circuit (hereinafter called ATD circuit) in MOS memory devices or other storage devices.

An ATD circuit used in a MOS memory is typically configured to generate a one-shot pulse upon detection of any change in address and to supply the pulse to a control circuit which responsively controls circuits in the memory.

FIG. 5 is a partial circuit diagram of a conventional semiconductor device.

The conventional semiconductor device shown here includes an address buffer circuit 1 and an ATD circuit 2. As illustrated, an address line A designating a memory address is coupled to an address buffer circuit 1 and supplied therein to a plurality of serial delay buffer elements (inverter circuits) IN1 through IN7. Signals from respective elements of the address buffer circuit 1 are coupled switching elements (NMOS transistors) N1 through N4 provided in the ATD circuit 2 to detect changes in condition of the address line A. A PMOS transistor P1 in the ATD circuit 2 is of a type normally ON to function as pull-up means. In the address buffer circuit 1, a signal of the address line A is introduced into inverter circuits IN2 and IN1. The signal from the address line A is illustrated as signal a, and an output signal from the inverter circuit IN1 as signal c. An output signal from the inverter circuit IN6 resulting from signal a passing through the inverter delay circuits (IN2, IN4 and IN6) is illustrated as signal b, and an output signal from the inverter circuit IN7 resulting from signal c passing through the inverter delay circuits (IN3, IN5 and IN7) is illustrated as signal d.

On the other hand, the NMOS transistor N1 supplied with signal a through the gate and the NMOS transistor N2 supplied with signal b through the gate are connected in series to form a NAND logic for signal a and signal b. The NMOS transistor N3 supplied with signal c at through the gate and the NMOS transistor N4 supplied with signal d through the gate are connected in series to form a NAND logic for signal c and signal d. The serial circuit of the NMOS transistors N1, N2 and the serial circuit of NMOS transistors N3, N4 are connected in parallel to form an AND logic for these two NAND logic circuits. One end of the NMOS transistor N2 and one end of the NMOS transistor N3 in two serial circuits are connected to ground GND, and one end of NMOS transistor N1 and one end of NMOS transistor N3 are connected to one end of the PMOS transistor P1. The other end of the PMOS transistor P1 is connected to a power source Vcc. Output from the ATD circuit is an output signal Fa as an address transition detection signal.

FIGS. 6A–6G are timing charts showing operations of the circuit construction described above.

FIG. 6A shows a signal from the address line A (signal a). FIG. 6B shows an output signal from the inverter circuit IN6 (signal b) obtained by passing signal a through the inverter delay circuits (IN2, IN4, IN6). FIG. 6C shows an output signal from the inverter circuit IN1 (signal c). FIG. 6D shows an output signal from the inverter circuit IN7 (signal d) obtained by passing signal c through the inverter delay circuits (IN3, IN5, IN7). FIG. 6E shows a NAND logic state based on the NMOS transistors N1 and N2. FIG. 6F shows a NAND logic state based on the NMOS transistors N3 and N4. FIG. 6G shows an AND logic output (output signal Fa of the ATD circuit) of the states shown in FIGS. 6E and 6F.

Inverters IN1 through IN7 in the address buffer circuit 1 individually behave as delay elements having a constant gate delay time td, respectively. Therefore, signals a through d are different in polarity and timing as shown in FIGS. 6A through 6D. Introduced into the NMOS transistors N1 through N4 are different two pairs of true-value compensation signals from the address buffer circuit 1.

If the address line A changes at points of time, t1, t6 and t11, as shown in FIG. 6A, then the signal c is inverted at points of time t2, t7 and t12 after a delay of td, respectively. On the other hand, signal b obtained by delaying signal a by three times the gate delay time td in the inverter circuits IN2, IN4 and IN6 is inverted at t4, t9 and t14 as shown in FIG. 6B. Signal d obtained by delaying signal c by three times the gate delay time td in the inverter circuits IN3, IN5 and IN7 is inverted at t5, t10 and t15 as shown in FIG. 6D.

Therefore, the NAND logic obtained by the NMOS transistors N1 and N2 is established when both signals a and b exhibit high levels, and satisfies the condition for the low level as shown in FIG. 6E. The NAND logic obtained by the NMOS transistors N3 and N4 is established when both signals c and d exhibit high levels, and satisfies the condition for the low level as shown in FIG. 6F. As a result, output signal Fa is output from the ATD circuit 2 as a low-level signal from the point of time t1 to t4 and from t11 to t14 as shown in FIG. 6G on the basis of the AND condition of the NAND condition output of signals a and b and the NAND condition output of signals c and d. Therefore, individual portions of the memory circuit can be controlled by using the one-shot pulse signal obtained by transition of the address line A.

The one-shot pulse signal Fa is typically employed in a circuit for controlling initialization of data lines, such as equalization of data lines, precharging of data lines, and so forth. Initialization of a data line is means for resetting data before address transition still remaining on the data line to the initial level, when address transition takes place upon access to data, so that data output from a memory cell after the address transition be quickly output onto the data line. The initial level is a level determined by the data line load transistor. In most cases, when the data line load transistor is a PMOS transistor, it is the (Vcc) level. When the data line load transistor is an NMOS transistor, it is the (Vcc-Vth) level.

Explained below are behaviors for data line initialization upon address transition. FIG. 7 shows a general construction of a typical semiconductor device. The semiconductor device of this type includes an address line A, address buffer circuit 1, ATD circuit 2, data line initialization control circuit 3, and memory circuit 4. The memory circuit 4 includes data line load transistors T1, T2, data line equalize transistor Te, data line precharge transistors Tp1, Tp2, data lines Da and Db in a complementary relationship, memory cell MC and word line WL. Data line load transistors T1, T2, data line equalize transistor Te, data line precharge transistors Tp1 and Tp2 shown here may be NMOS transistors, respectively.

Next shown in FIG. 8 is a waveform diagram during operation of data lines in the semiconductor device shown in FIG. 7. Here are shown, particularly, the waveform of an output signal Di from the data line initialize control circuit 3 and waveforms in complementary data lines Da and Db.

When transition of the address line A takes place, a one-shot pulse signal Fa is output from the ATD circuit 2. The one-shot pulse signal Fa is introduced into the data line initialization control circuit 3 supplied with a decoded signal, etc., synthesized with the decoded signal, etc., and output as a one-shot pulse signal Di from the control circuit 3. The one-shot pulse signal Di is input to the data line equalize transistor Te and the data line precharge transistors Tp1, Tp2. The data line equalize transistor Te and the data line precharge transistors Tp1, Tp2 are changed ON by the one-shot pulse signal Di for a moment. As a result, data lien Da and data line Db are equalized by the data line equalize transistor Te. Simultaneously, data line Da and data line Db are precharged by the data line precharge transistors Tp1, Tp2 to the initial level, namely (Vcc-Vth) level. During the initializing period of the data lines, the word line after address transition is activated; and upon completion of initialization of the data lines, namely, at the same time when the one-shot pulse signal Di changes to the low level, and the data line equalize transistor Te and data line precharge transistors Tp1, Tp2 are changed to OFF, data from the memory cell MC after address transition is output onto the data line.

For reference, FIG. 9 shows a waveform diagram of data lines under operation upon access to data in a device without means for initializing data lines. As shown here, inversion of data line Da and data line Db are effected only by a small driving power of the memory cell, and much time is required for data inversion. It results in a great delay in access time.

As explained above, when address transition takes place, data lines are always reset by the data line initialize means to the (Vcc-Vth) level, which is the same as the level determined by data line load transistors. In this manner, data inversion of data lines are effected quickly, and quick access to data is realized.

As shown in the waveform diagram of FIG. 8, access to data is effectuated after the data lines are initialized, namely, after the one-shot pulse signal Di changes to the low level. That is, the access time depends upon the pulse width of the output signal Fa from the ATD circuit 2. When the pulse width of the output signal Fa of the ATD circuit 2 becomes longer, the access time tends to delay. However, if the pulse width of the output signal Fa from the ATD circuit 2 is made excessively short, then the data before the address transition remains on data lines, and results in delaying the data inversion time of the data lines and in delaying the access time.

In this manner, the pulse width of the output signal Fa of the ATD circuit 2, either too long or too short, causes a delay in access time, and it is difficult to set and maintain an appropriate pulse width. In general, the pulse width of the output signal Fa of the ATD circuit is designed and determined by simulation of IC operation. However, operative characteristics of a real device (IC as a product) do not always coincide with the result of the simulation. Even when an optimum pulse width is determined by the simulation, the real device may fail to provide the pulse width determined by the simulation.

Therefore, for preparation against such undesirable cases, IC be designed to enable adjustment of the ATD pulse width upon estimation of IC characteristics after fabrication. FIG. 10 shows a circuit for adjusting the ATD pulse width.

As shown in FIG. 10, previously prepared is a PMOS transistor P3 having W=5 μm, which may be normally ON for example, in addition to normally ON-state PMOS transistors P1 and P2 having W=5 μm connected to the output of the ATD circuit 2 to behave as pull-up means.

Here, "W" is the channel width of the diffusion layer of a transistor. FIGS. 11A and 11B are diagrams for explaining the channel width, in which FIG. 11A is a plan view, FIG. 11B is a cross-sectional view. A diffusion layer 111 and a gate electrode 112 of a transistor formed as illustrated, and the channel width is as shown here.

When an IC needs adjustment of the ATD pulse width, using a focusing ion beam apparatus (FIB apparatus), or the like, the output line (Fa) of the ATD circuit 2 is processed by connecting or cutting wirings W1 to W3 to change the size of the normally ON-state PMOS transistor operative as pull-up means and to thereby adjust the ATD pulse width.

In greater detail, if wires W1 and W2 are already connected, wire W3 is connected to the output line (Fa) of the ATD circuit 3 when the function as pull-up means with W=15 μm is desired. When the function as pull-up means with W=5 μm is desired, the ATD pulse width is adjusted by cutting the wire W2 from the output line (Fa) of the ATD circuit 2.

As explained above, for enabling adjustment of the pulse width of the output signal Fa of the ATD circuit 2, normally ON-state PMOS transistors P1, P2 and P3 are prepared to be re-combined by cutting or connecting the wiring on a real device by using a FIB apparatus, for example. However, adjustment of the pulse width in this manner involves the following problems.

The first problem lies in that only one pulse width and no other pulse width can be tried with a single IC sample because it is very difficult to re-process a device once processed because of the nature of the FIB apparatus. Therefore, to try a plurality of pulse widths, a corresponding number of IC samples must be prepared. Since IC samples must exhibit the same operative characteristics, there arises the need for selecting such IC samples by using a tester.

The second problem lies in that processing of a device by a FIB apparatus, or the like, does not always result in success. For example, for cutting aluminum wiring, which relies on irradiation of an ion beam to the aluminum wiring to scrape off a part of aluminum, shortage in irradiation time of the ion beam will result in failure to fully remove the aluminum wiring and to cut off the wiring, and an excessive irradiation time of the ion beam will result in removing the inter-layer insulating film under the aluminum wiring and in finally breaking the device when the ion beam reaches the substrate. As to connection of a wiring, an aluminum wiring, for example, is connected by making a hole in an inter-layer insulating film overlying the aluminum wiring by using an ion beam and by stacking tungsten or another metal in the hole by vapor deposition. However, similarly to the cutting process of aluminum wiring, it may result in failure, depending upon the irradiation time of the ion beam.

Thus, the process of cutting and connection of wiring on a device by a FIB apparatus, or the like, does not result in success, depending upon the selected irradiation time of the ion beam.

Summarizing the foregoing discussion, previously prepared normally-ON PMOS transistors P1, P2 and P3 are recombined for adjusting the pulse width of the output signal Fa of the ATD circuit, and the recombination is made by cutting or connecting a wiring on a real device by using a FIB apparatus, or the like. However, the first problem with this method is the need for an additional process of selecting IC samples having the same operative characteristics through a tester to try different pulse widths, and the second problem is that devices cannot be processed successfully unless the irradiation time of an ion beam in a FIB apparatus is set within a strictly appropriate range.

SUMMARY OF THE INVENTION

It is therefore the first object of the invention to provide a highly reliable semiconductor circuit device enabling quick and reliable adjustment of the ATD pulse width.

The second object of the invention is to provide a highly reliable semiconductor circuit device enabling quick and reliable adjustment of the ATD pulse width by changing the duration of a predetermined level of a pulsating waveform applied to an extra terminal and by accordingly changing the size of a MOS transistor behaving as pull-up means of the ATD circuit.

According to the present invention, there is provided a semiconductor device comprising:

a terminal for receiving a pulse signal having a predetermined width of time;

first to n-th controllers responsive to said predetermined width of time of said pulse signal received from said terminal to output control signals of predetermined high levels or low levels, respectively; and an address transition detector including n transistors connected in parallel to an output line and a logic circuit connected to said output line to control ON/OFF actions of said n transistors by applying said control signals output from said first to n-th controllers to gates of said n transistors, respectively.

The present invention provides a highly reliable semiconductor device which makes it possible to change sizes of PMOS transistors behaving as pull-up means of the ATD circuit by changing the duration of high level in a pulse-like waveform, and to reliably adjust the ATD pulse in a short time.

BRIEF DESCRIPTION OF THE DRAWINGS

In the attached drawings:

FIG. 10 is a diagram of a circuit for adjusting the ATD pulse width; and

FIGS. 11A and 11B are diagrams for explaining the channel width.

DESCRIPTION OF THE PREFERRED EMBODIMENTS

Explained below are embodiments of the invention with reference to the drawings.

Figure 1:
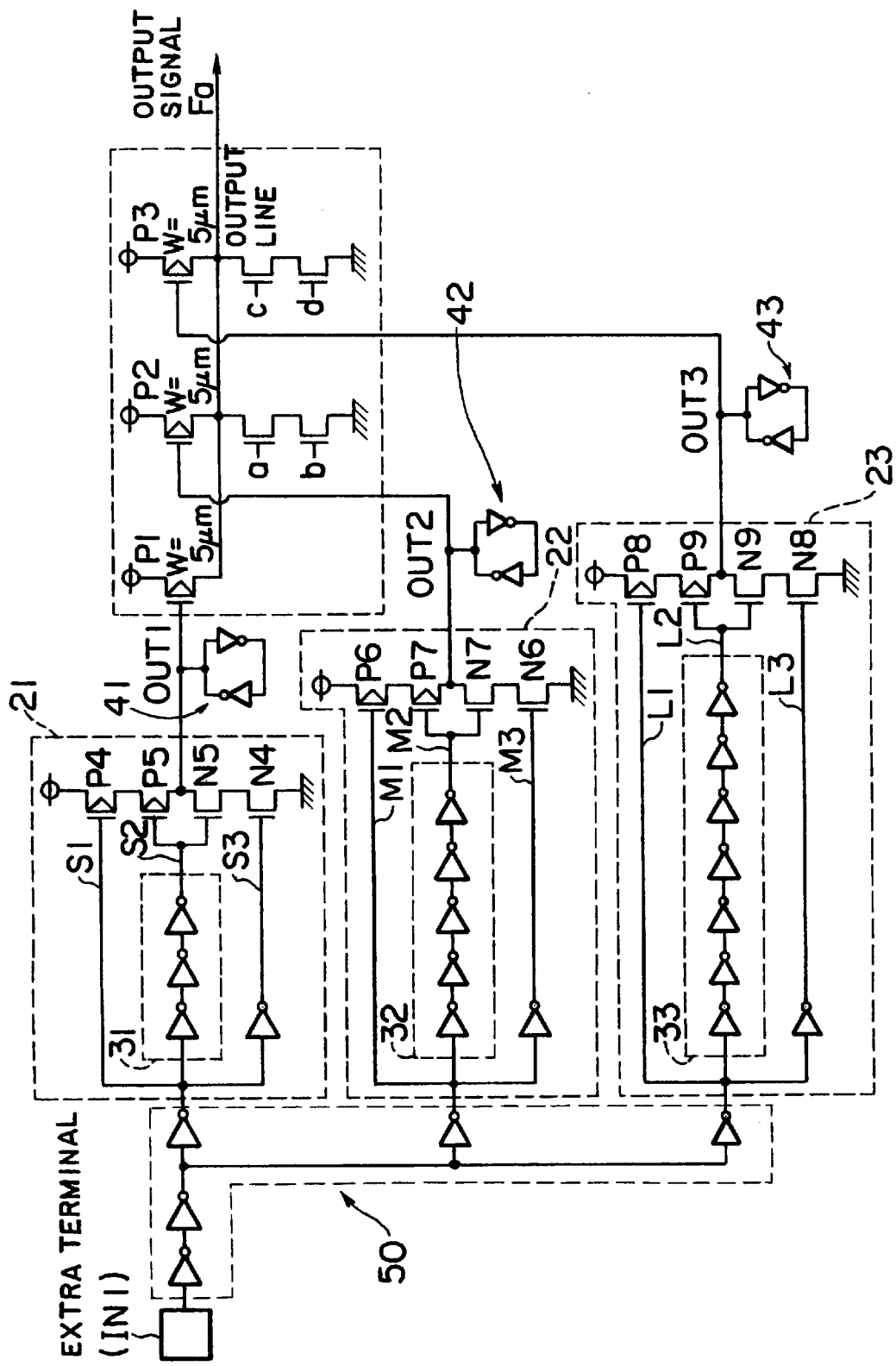
FIG. 1 is a circuit diagram of a semiconductor device according to the invention.

FIG. 1 is a circuit diagram of a semiconductor device according to the invention. As illustrated here, the semiconductor device includes an ATD circuit 10, first to three control circuits 21 to 23, and first to three latch circuits 41 to 43 provided at outputs of the first to third control circuits 21 through 23, respectively. The device may further include an input circuit 50.

The ATD circuit 10 has PMOS transistors P1, P2, P3 behaving as pull-up means. The first control circuit 21 has a first delay circuit 31, PMOS transistors P4, P5, and NMOS transistors N4, N5. The second control circuit 22 includes a second delay circuit 32, PMOS transistors P6, P7, and NMOS transistors N6, N7. The third control circuit 23 includes a third delay circuit 33, PMOS transistors P8, P9, and NMOS transistors N8 and N9. Delay times of the first to third delay circuits 31 through 33 are determined to satisfy the relation of first delay circuit 31<second delay circuit 32 <third delay circuit 33 namely, so that the delay time of the first delay time 31 is shortest and the delay time of the third delay circuit 33 is longest.

An extra terminal (IN1) is provided as a common input of the first to third control circuits 21 through 23 to introduce a signal, through an input circuit 50, if so required. Similarly to an address input terminal, etc., the extra terminal (IN1) may be provided as a terminal of IC to permit voltage control from the exterior of IC.

In the embodiment shown here, a pulse waveform is applied to the extra terminal (IN1) to control voltages of the first output (OUT1) to third output (OUT3) from the first control circuit 21 through the third control circuit 23, namely the gate voltages of the PMOS transistors P1, P2, P3 behaving as pull-up means of the ATD circuit 10, by changing the pulse time and to thereby control ON/OFF actions of the PMOS transistors P1, P2, P3 so as to control the pulse width of the output signal Fa of the ATD circuit 10.

Explained below are behaviors more specifically.

Figure 2:
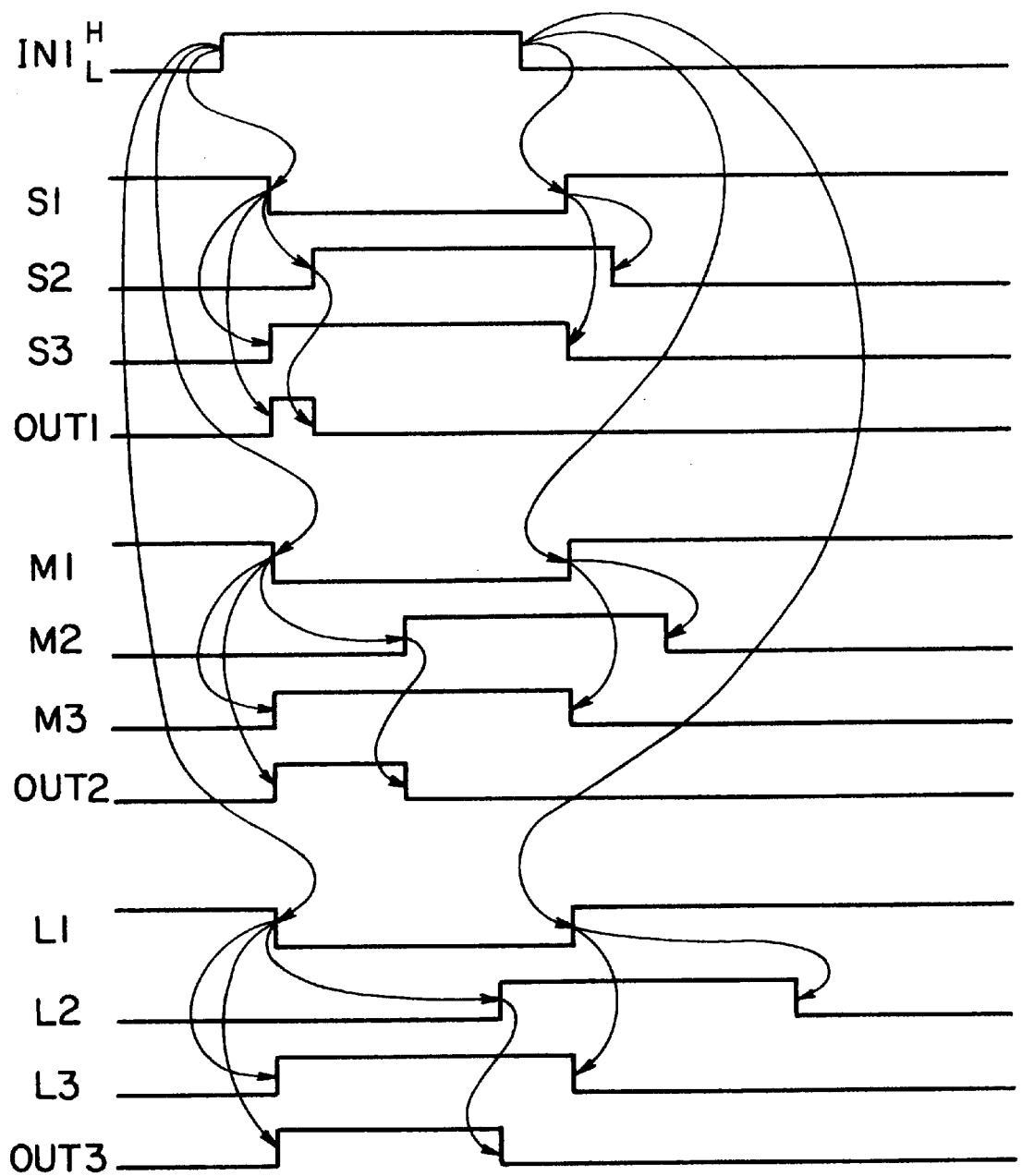
FIG. 2 is a waveform diagram (1) of the circuit of the semiconductor device shown in FIG. 1.
Figure 3:
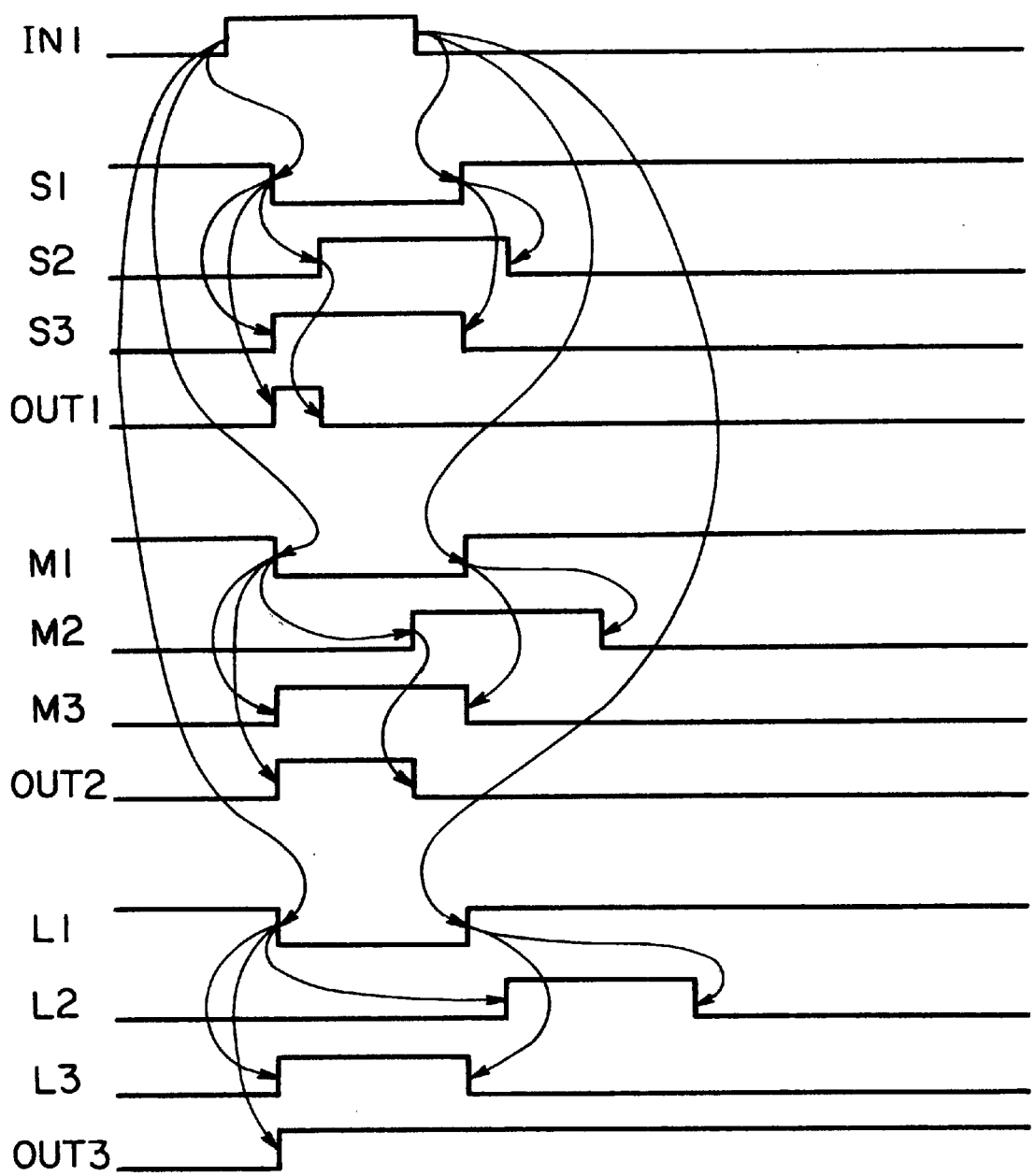
FIG. 3 is a waveform diagram (2) of the circuit diagram of the semiconductor service shown in FIG. 1.
Figure 4:
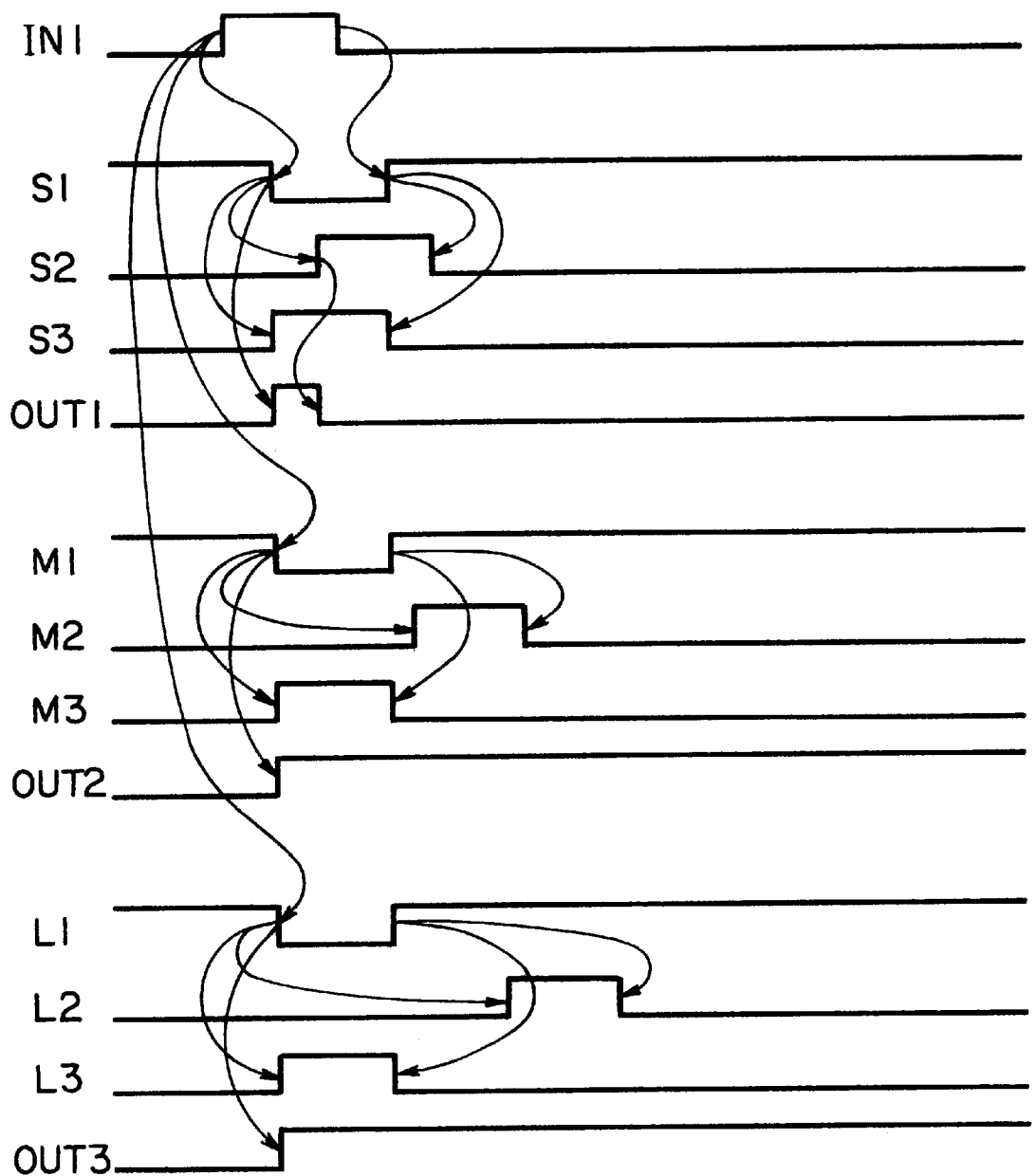
FIG. 4 is a waveform diagram (3) of the circuit of the semiconductor device showing in FIG. 1.
Figure 5:
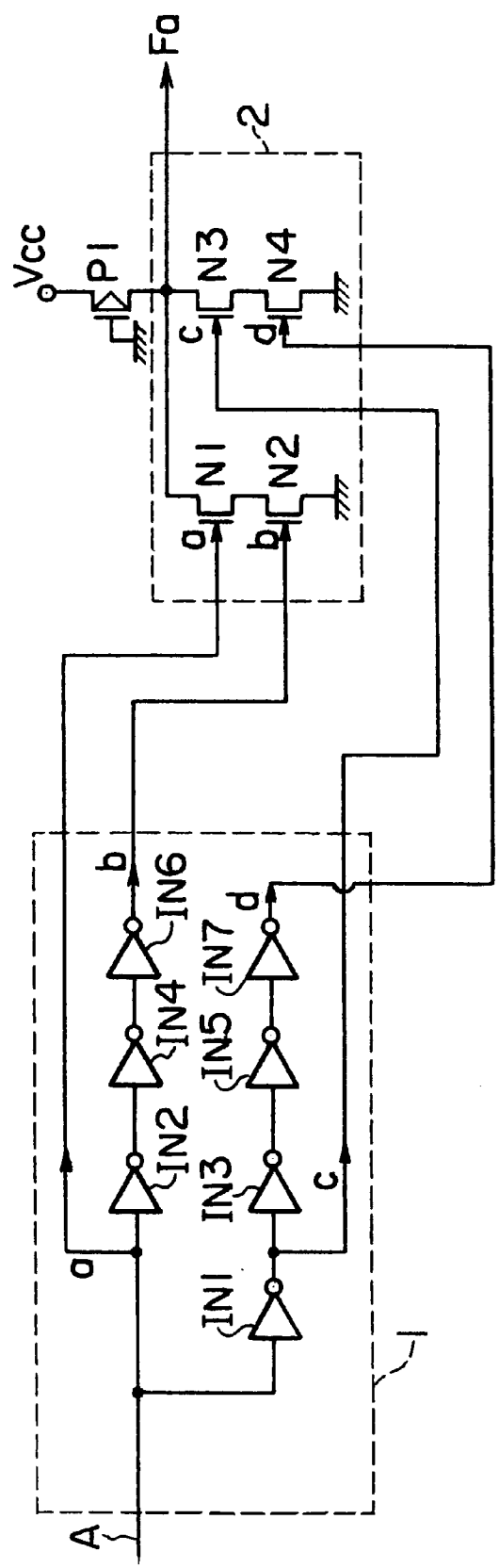
FIG. 5 is a partial circuit diagram of a conventional semiconductor device.
Figure 6:
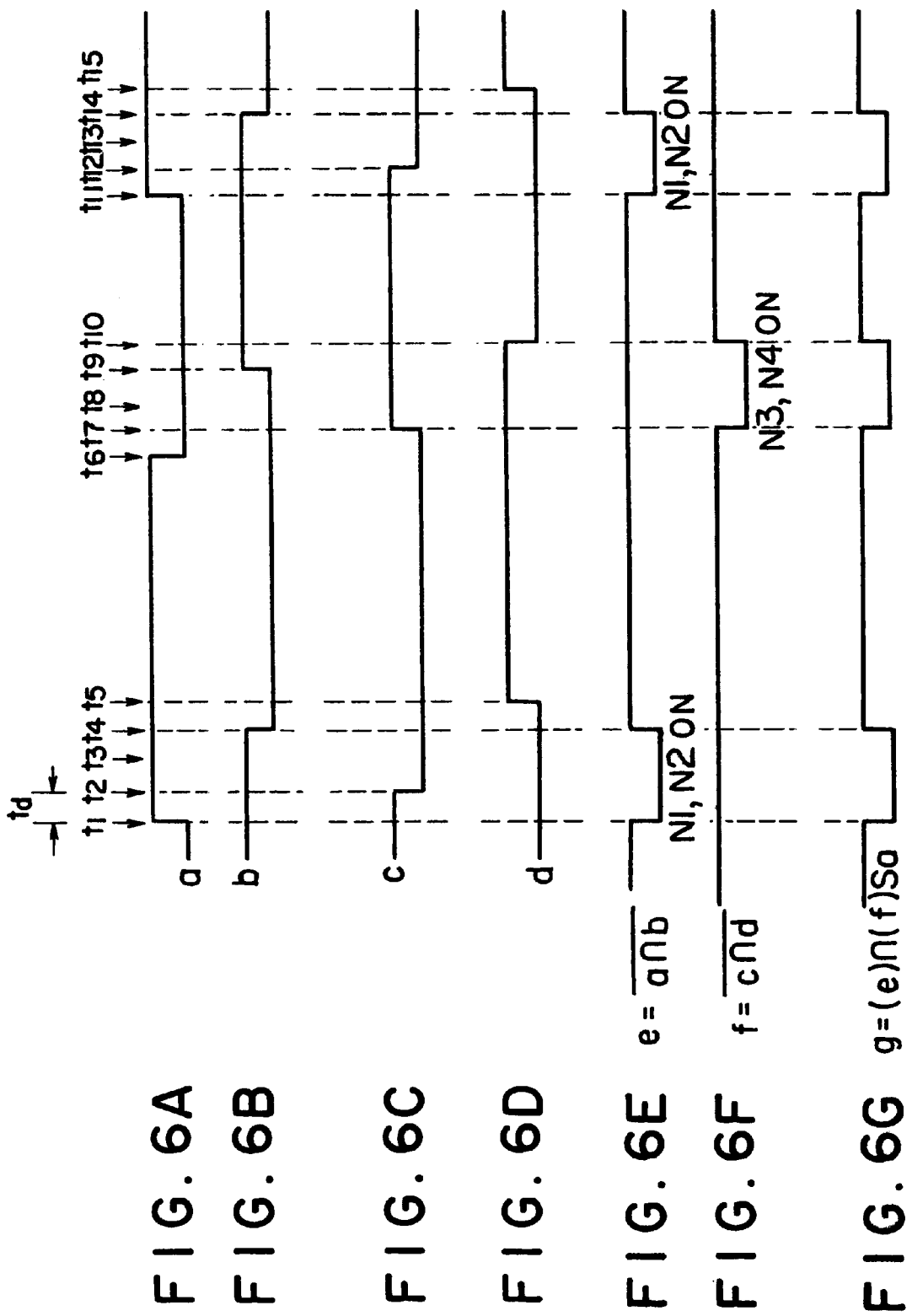
FIGS. 6A–6G is a timing chart for explaining behaviors of the semiconductor device shown in FIG. 5.
Figure 7:
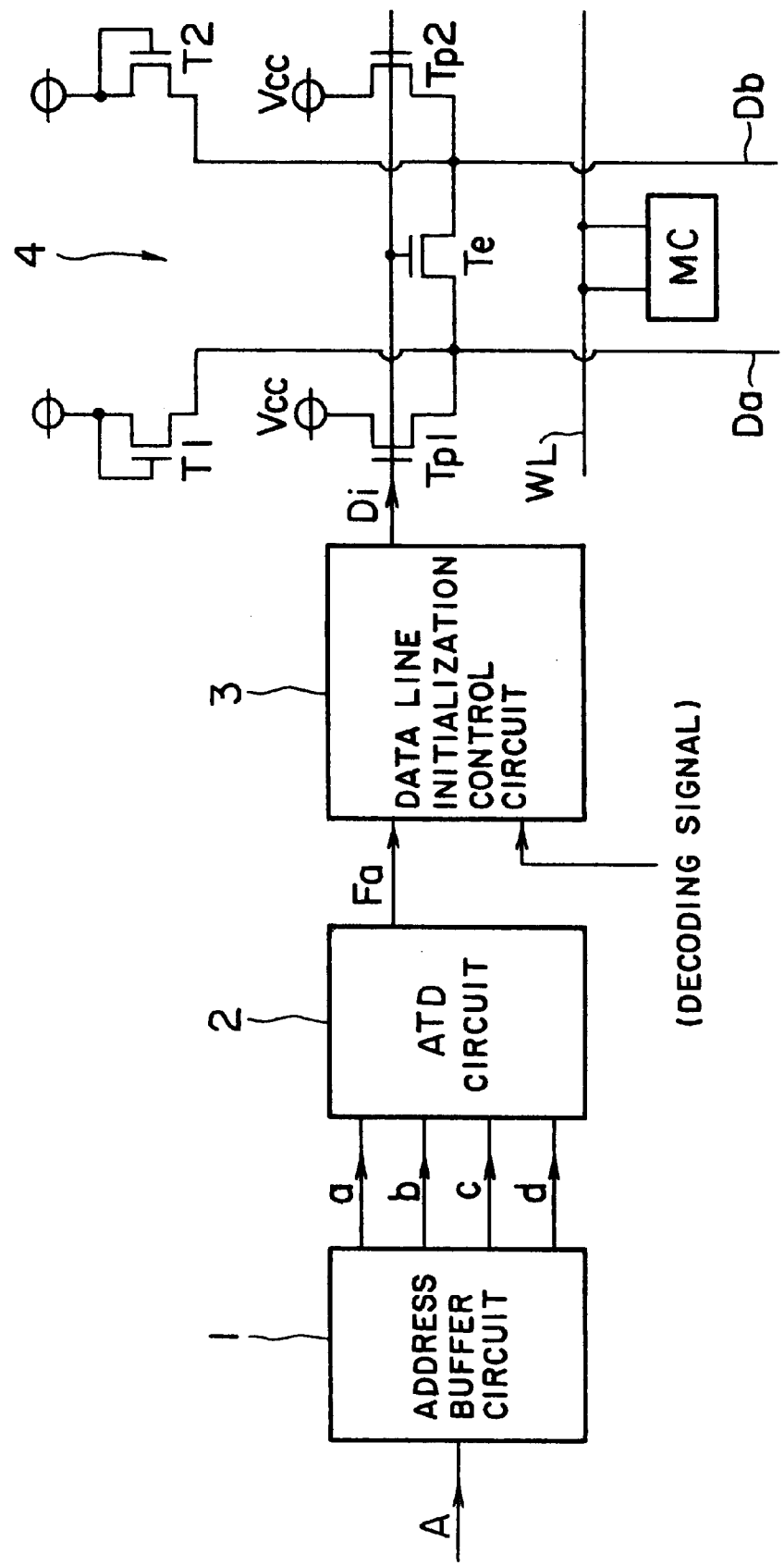
FIG. 7 is a diagram showing a general construction of a typical semiconductor device.
Figure 8:
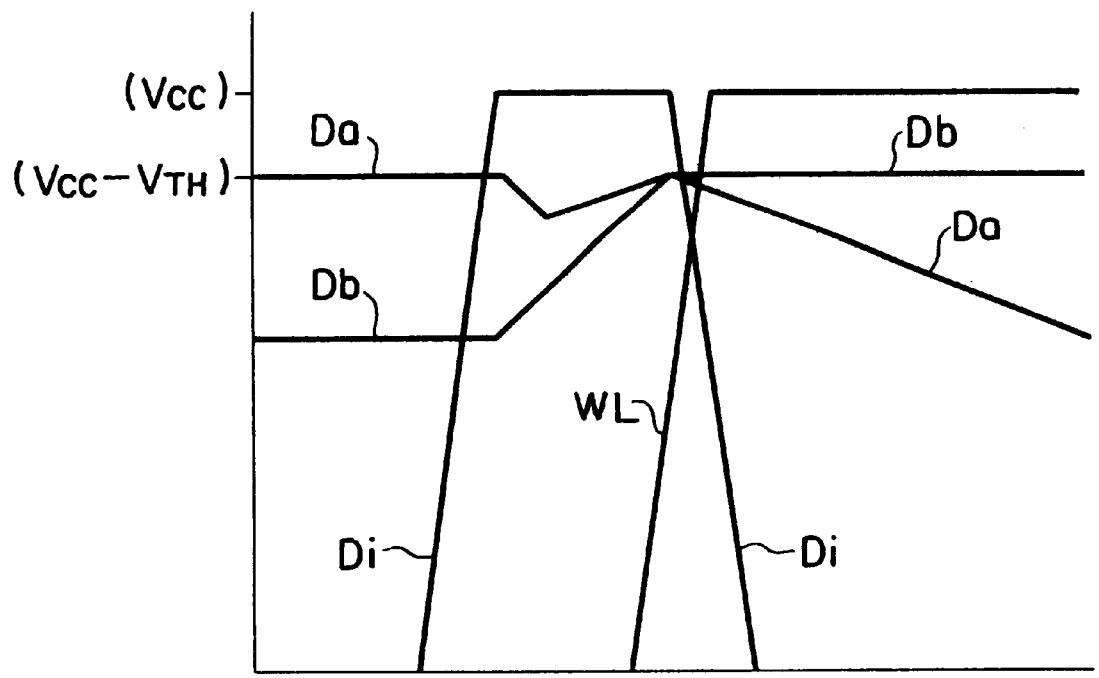
FIG. 8 is a waveform diagram showing level change in data lines during operation of a semiconductor device shown in FIG. 7.
Figure 9:
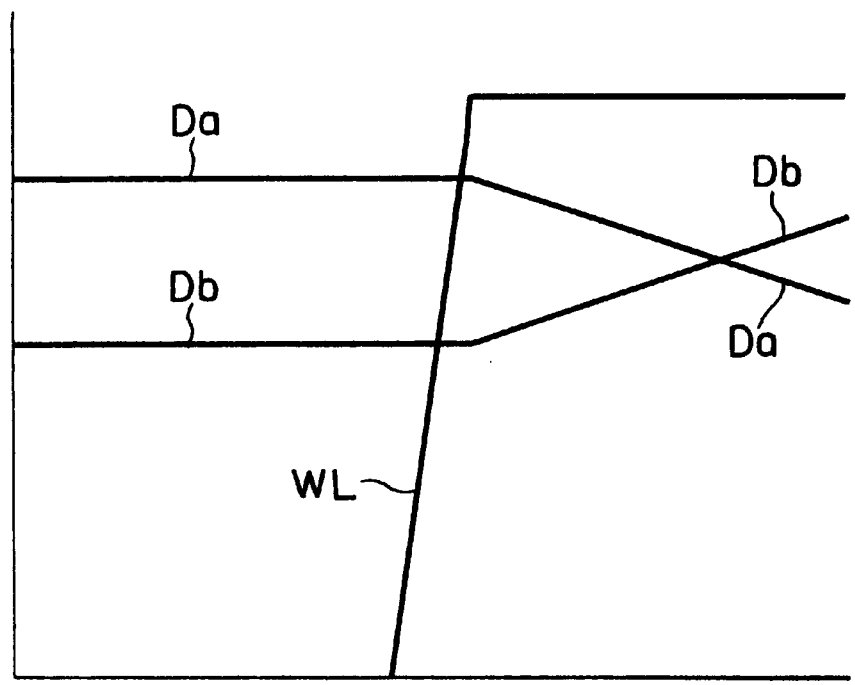
FIG. 9 is a waveform diagram showing level change in data lines during operation of a semiconductor device with no initializing means on the data lines.

FIGS. 2 through 4 show waveform diagrams (1) through (3) of the circuit of the semiconductor device shown in FIG. 1.

The waveform diagram (1) in FIG. 2 show waveforms for setting PMOS transistors as pull-up means of the ATD circuit 10 to W=15 µm.

As shown here, a pulse-like waveform of "L"→"H"→"L" is introduced into the extra terminal (IN1). When the extra terminal (IN1) is in the normal state with the "L" level, signal (S2), signal (M2), signal (L2), signal (S3), signal (M3) and signal (L3), in the same phase with the extra terminal (IN1), are in "L" levels. Signal (S1), signal (M1) and signal (L1) in the opposite phase from the extra terminal (IN1) are in "H" levels.

Under the condition, the PMOS transistor P4 and NMOS transistors N4, N5 of the first control circuit 21 are OFF, and the PMOS transistor P3 is ON. Similarly, the PMOS transistor P6 and NMOS transistors N6, N7 of the second control circuit 22 are OFF, and the PMOS transistor P7 is ON. Also, the PMOS transistor P8, NMOS transistors N8, N9 of the third control circuit 23 are OFF, and the PMOS transistor P9 is ON. Therefore, there is no output from the first control circuit 21 to the first output (OUT1), and it is supplied with random data determined by the first latch circuit 41. Similarly, with no output from the second control circuit 22, random data determined by the second latch circuit 42 is applied to the second output (OUT2), and with not output from the third control circuit 23, random data determined by the third latch circuit 43 is applied to the third output (OUT3). Therefore, FIG. 2 shows the first output (OUT1), second output (OUT2) and third output (OUT3) as being applied with "1" levels.

In response to transition at the extra terminal (IN1) from the "L" level to the "H" level, signal (S3), signal (M3) and signal (L3) change to "H" levels. As a result, NMOS transistors N4, N6, N8 are changed ON. Simultaneously, signal (S1), signal (M1) and signal (L1) change to "L" levels. As a result, PMOS transistors P4, P6, P8 become ON. At that time, since signal (S2), signal (M2) and signal (L2) are in "L" levels, NMOS transistors N5, N7, N9 are OFF, and PMOS transistors P5, P7, P9 are ON. It results in outputting "H" levels from PMOS transistors P4, P5 to the second output (OUT1), "H" levels from PMOS transistors P6, P7 to the second output (OUT2), and "H" levels from PMOS transistors P8, P9 to the third output (OUT3). As a result, gate voltages of PMOS transistors P1, P2, P3 as pull-up means of the ATD circuit 10 exhibit "H" levels, and all of the PMOS transistors P1, P2, P3 are changed to OFF states. That is, by changing the extra terminal (IN1) states from the "L" level to the "H" level, all of the PMOS transistors P1, P2 P3 behaving as pull-up means of the ATD circuit 10 are set to OFF states.

After that, in response to transition of signal (S1) to the "L" level, signal (S2) changes to the "H" level through the first delay circuit 31. Similarly, signal (M2) changes to the "H" level through the second delay circuit 32 in response to transition of signal (M1) to the "L" level, and signal (L2) changes to the "H" level via the third delay circuit 33 in response to transition of signal (L1) to the "L" level. As a result, PMOS transistors P5, P7, P9 become OFF, and NMOS transistors N5, N7, N9 become ON. At that time, since also the NMOS transistors N4, N6, N8 are ON, "L" levels are output from the MOS transistors N4, N5 to the first output (OUT1), "L" levels are output from the NMOS transistors N6, N7 to the second output (OUT2), and "L" levels are output from the NMOS transistors N8, N9 to the third output (OUT3). As a result, gate voltages of PMOS transistors P1, P2, P3 behaving as pull-up means of the ATD circuit 10 are changed to "L" levels, and all of PMOS transistors P1, P2, P3 are changed ON. Thus, the PMOS transistors as pull-up means of the ATD circuit 10 function as transistors of W=15 μm. After that, the extra terminal (IN1) is changed from the "H" level to the "L" level. In response to transition of the extra terminal (IN1) to the "L" level, signal (S1), signal (M1) and signal (L1) are changed to "H" levels. As a result, PMOS transistors P4, P6, P8 are made OFF. Simultaneously, signal (S3), signal (M3) and signal (L3) are changed to "L" levels. As a result, NMOS transistors N4, N6, N8 are made OFF. At that time, where signal (S2), signal (M2), signal (L2) exhibit "H" levels, PMOS transistors P5, P7, P9 are in OFF states, and NMOS transistors N5, N7, N9 are in ON states. That is, although the PMOS transistor P5 is OFF and the NMOS transistor N5 is ON, the PMOS transistors P4, NMOS transistor N4 are in OFF states. Therefore, without supply of either the "H" level or the "L" level to the first output (OUT1) from the first control circuit 21, and it results in holding the level just before the transition of the extra terminal (IN1) from the "H" level to the "H" level in the first latch circuit 41 and results in maintaining the "L" level at the first output (OUT1) by means of the first latch circuit 41.

Similarly, although the PMOS transistors P6, P7 are in OFF states and the NMOS transistor N7 is ON, the NMOS transistor N6 is OFF. Therefore, neither the "H" level nor the "L" level is applied from the second control circuit 22 to the second output (OUT2), and the second output (OUT2) continuously maintains the "L" level by means of the latch circuit 2. Similarly, although the PMOS transistors P8, P9 are OFF and the NMOS transistor N9 is ON, NMOS transistors N8 is OFF. Therefore, neither the "H" level nor the "L" level is supplied from the third control circuit 23 to the third output (OUT3), and the third output (OUT3) continuously maintains the "L" level by means of the third latch circuit 43.

It results in continuously applying "L" levels as gate voltages of the PMOS transistors P1, P2, P3 behaving as pull-up means of the ATD circuit 10, and results in the PMOS transistors P1, P2, P3 maintaining ON states and continuously behaving as pull-up transistors with W=15 μm.

Next explained is the waveform diagram (2) shown in FIG. 3.

The waveform diagram (2) shows waveforms for setting PMOS transistors behaving as pull-up means of the ATD circuit 10 to W=10 μm.

As shown in the diagram, a pulse waveform of "L"→"H"→"L" is applied to the extra terminal (IN1). Immediately after transition of the extra terminal (IN1) from the "L" level to the "H" level, "H" levels are output from the first control circuit 21, second control circuit 22, and third control circuit 23 to the first output (OUT1), second output (OUT2) and third output (OUT3), respectively. Therefore, all of the PMOS transistors P1, P2, P3 behaving as pull-up means of the ATD circuit 10 are set in OFF states.

After that, in response to transition of signal (S2) to the "H" level through the first delay circuit 31, the first output (OUT1) changes to the "L" level, the gate voltage of the PMOS transistor P1 as pull up means of the ATD circuit 10 changes to the "L" level, and the PMOS transistor P1 becomes ON. Similarly, in response to transition of signal (M2) to the "H" level through the second delay circuit 32, the second output (OUT2) changes to the "L" level, the gate voltage of the PMOS transistor as pull-up means of the ATD circuit changes to the "L" level, and the PMOS transistor P2 becomes ON.

Although signal (L2) is changed to the "H" level through the third delay circuit 33, the extra terminal (IN1) is changed from the "H" level to the "L" level before transition of signal (L2) to the "H" level. In this case, since signal (L1) is changes to the "H" level and signal (L3) to the "L" level, PMOS transistor P8 and NMOS transistor N8 turn OFF. Without supply of either the "H" level or the "L" level, the third output (OUT3) results in continuously maintaining the "H" level by means of the third latch circuit 43.

It results in "L" levels being applied as gate voltages of PMOS transistors P1, P2 behaving as pull up means of the ATD circuit 10; however, it results in the "H" level being applied as the gate voltage of the PMOS transistor 3. Since the PMOS transistors P1, P2 are in ON states and the PMOS transistor P3 is OFF, PMOS transistors as pull-up means of the ATD circuit 10 function as pull-up transistors with W=10 μm.

Next explained is the waveform diagram (3) shown in FIG. 4.

The waveform diagram (3) shows waveforms upon setting PMOS transistors as pull-up means of the ATD circuit 10 to W=5 μm.

As shown in the diagram, a pulse waveform of "L"→"H"→"L" is applied to the extra terminal (IN1). Immediately after transition of the extra terminal (IN1) from the "L" level to the "H" level, "H" levels are output from the first control circuit 21, second control circuit 22, and third control circuit 23 to the first output (OUT1), second output (OUT2) and third output (OUT3), respectively. Therefore, all of the PMOS transistors P1, P2, P3 behaving as pull-up means of the ATD circuit 10 are set in OFF states.

After that, in response to transition of signal (S2) to the "H" level through the first delay circuit 31, the first output (OUT1) changes to the "L" level, the gate voltage of the PMOS transistor P1 as pull up means of the ATD circuit 10 changes to the "L" level, and the PMOS transistor P1 becomes ON. Although signal (M2) is also changed to the "H" level through the second delay circuit 32, the extra terminal (IN1) is changed to from the "H" level to the "L" level before transition of signal (M2) to the "H" level. In this case, since signal (M1) is changed to the "H" level and signal (M3) to the "L" level, PMOS transistor P6 and NMOS transistor N6 are made OFF, and it results in maintaining the "H" level in the second output (OUT2) by means of the second latch circuit 42.

Similarly, signal (L1) changes to the "H" level and signal (L3) to the "L" level. Therefore, PMOS transistor P8 and NMOS transistor N8 are changed to OFF states, and the third output (OUT3) is not supplied with either with the "H" level or the "L" level from the control circuit, and results in continuously maintaining the "H" level by means of the third latch circuit 43.

As a result, the "L" level is applied as the gate voltage of the PMOS transistor P1 behaving as pull-up means of the ATD circuit 10. However, since "H" levels are applied as gate voltages of the PMOS transistors P2 and P3, which results in the PMOS transistor P1 being ON and PMOS transistors P2 and P3 being OFF, the PMOS transistors behaving as pull-up means of the ATD circuit 10 behave as pull-up transistors with W=5 $\mu$m.

It is also possible to change sizes of MOS transistors by changing the duration of time of the "L" level in the pulse wavelength of "H"→"L"→"H" applied to the extra terminal in lieu of the pulse waveform of "L"→"H"→"L". It can be realized appropriately by adding or removing inverter circuits in the input circuit from the extra terminal.

Additionally, the technical concept of the present invention is applicable also to a device in which PMOS transistors P1 through P3 of the ATD circuit are replaced with NMOS transistors.

Moreover, although the embodiments, shown above, uses three transistors in the ATD circuit, any N transistors may be used, and may be controlled by N control circuits, N latch circuits, and so forth.

As described above, the invention can provide a highly reliable semiconductor device which makes it possible to change sizes of PMOS transistors behaving as pull-up means of the ATD circuit by changing the duration of time of the "H" level in a pulse waveform of "L"→"H"→"L", for example, and to reliably adjust the ATD pulse in a short time.

What is claimed is:

1. A semiconductor device comprising:

a terminal for receiving a pulse signal having a predetermined width of time;

first to n-th (n is a positive integer) controllers responsive to said predetermined width of time of said pulse signal received from said terminal to output control signals of predetermined high levels or low levels, respectively; and an address transition detector including n different transistors connected in parallel to an output line and a logic circuit connected to said output line, said detector controlling ON/OFF actions of said n different transistors by applying said control signals output from said first to n-th controllers to gates of said n different transistors, respectively.

2. The semiconductor device according to claim 1 wherein said first to n-th controllers include first to n-th delay circuits, respectively, said delay circuits having delay times gradually increasing from a shortest delay time of said first delay circuit to a longest delay time of said n-th delay circuit.

3. The semiconductor device according to claim 1 wherein each of said first to n-th controllers include:

a delay circuit; and a series connected circuit connecting first and second PMOS transistors and first and second NMOS transistors, said series connected circuit having one end connected to a power source and another end connected to ground, a pulse signal from said terminal being input to the gate of said first PMOS transistor and to said delay circuit, an output from said delay circuit being input to gates of said second PMOS transistor and said first NMOS transistor, an inversion signal inverted from said pulse signal from said terminal being input to the gate of said second NMOS transistor, and said control signals being output from the connection point of said second PMOS transistor and said first NMOS transistor.

4. The semiconductor device according to claim 1 wherein each of said first to n-th controllers has a latch circuit at the output side thereof.

5. The semiconductor device according to claim 1 wherein each said transistor of said address transition detector has a predetermined channel width, one end of the source or drain thereof being connected to the power source, the other end of the source or drain thereof being connected to said output line, and said logic circuit being connected at the output thereof to said output line.

6. The semiconductor device according to claim 1 wherein said address transition detector means determines the channel width of each of said n different transistors behaving as pull-up means by controlling ON/OFF actions of said different transistors in response to said control signals from said first to n-th controllers.

* * * * *